(12) United States Patent
Lam

(10) Patent No.: US 7,827,224 B1
(45) Date of Patent: Nov. 2, 2010

(54) MOVABLE TAP FINITE IMPULSE RESPONSE FILTER

(75) Inventor: Yat-Tung Lam, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 916 days.

(21) Appl. No.: 11/545,204

(22) Filed: Oct. 10, 2006

Related U.S. Application Data

(62) Division of application No. 09/678,728, filed on Oct. 4, 2000, now Pat. No. 7,127,481.

(51) Int. Cl.
*G06F 17/10* (2006.01)

(52) U.S. Cl. ...................................................... 708/319

(58) Field of Classification Search .................. 708/319
See application file for complete search history.

(56) References Cited

U.S. PATENT DOCUMENTS

| | | | |
|---|---|---|---|
| 3,665,171 A | 5/1972 | Morrow | |
| 3,703,632 A | 11/1972 | Shanks | |
| 4,124,889 A | 11/1978 | Kaufman et al. | |
| 4,344,149 A | 8/1982 | Van De Meeberg et al. | |
| 4,488,251 A | 12/1984 | Wischermann | |
| 5,050,119 A | 9/1991 | Lish | |
| 5,118,241 A | 6/1992 | Cochran et al. | |
| 5,119,326 A | 6/1992 | Cochran et al. | |
| 5,212,660 A | 5/1993 | Orihara | |
| 5,222,035 A | 6/1993 | Nakase et al. | |
| 5,235,538 A | 8/1993 | Sumi et al. | |
| 5,245,561 A | 9/1993 | Sugiyama | |
| 5,333,119 A | 7/1994 | Raatz et al. | |
| 5,388,062 A | 2/1995 | Knutson | |
| 5,487,023 A * | 1/1996 | Seckora | 708/316 |
| 5,535,150 A | 7/1996 | Chiang | |
| 5,777,910 A | 7/1998 | Lu | |
| 6,035,312 A | 3/2000 | Hasegawa | |
| 6,035,320 A | 3/2000 | Kiriaki et al. | |
| 2002/0042802 A1 * | 4/2002 | Mogi et al. | 708/319 |

FOREIGN PATENT DOCUMENTS

| WO | WO 99/46867 | 9/1999 |
|---|---|---|
| WO | WO 46867 | 9/1999 |

OTHER PUBLICATIONS

"An Adaptive Multiple Echo Canceller for Slowly Time Varying Echo Paths", Yip and Etter, IEEE Transactions on Communications, Oct. 1990.

(Continued)

*Primary Examiner*—Tan V Mai

(57) ABSTRACT

A method selects a period of delay in an FIR filter having (i) a plurality of delay elements and (ii) a plurality of coefficient taps each associated with a portion of an input signal in corresponding stages of delay from a corresponding delay element, in which at least one delay element has a period of delay that is selectable. The method includes measuring components of an input signal so as to identify a sequence of components that are smaller than another sequence of larger components. The method includes setting the selectable period of delay to prevent application of the identified sequence of smaller components of the input signal to the coefficient taps.

6 Claims, 10 Drawing Sheets

OTHER PUBLICATIONS

"Digital Signal Processing", Alan V. Oppenheim et al., pp. 155-163.

"A 100 MHz Output Rate Analog-to-Digital Interface for PRML Magnetic-Disk Read Channels in 1.2 um CMOS", Gregory T. Uehara and Paul R. Gray, ISSCC94/Session 17/Disk-Drive Electronics/Paper FA 17.3, 1994 IEEE International Solid-State Circuits Conference, pp. 280-281.

"72Mb/s PRML Disk-Drive Channel chip with an Analog Sampled Data Signal Processor", Richard G. Yamasaki et al., ISCC94/Session 17/Disk-Drive Electronics/Paper FA 17.2, 1994 IEEE International Solid State Circuits Conference, pp. 278-279.

"A Discrete-Time Analog Signal Processor for Disk Read Channels", Ramon Gomez et al., ISSCC93/Session 12/Hard Disk and Tape Drives/Paper FA 13.1, 1993 ISSCC Slide Supplement, pp. 162-163 and 279-280.

"A 50 MHz 70 mW 8-Tap Adaptive Equalizer/Viterbi Sequence Detector in 1.2 um CMOS", Gregory T. Uehara et al., 1994 IEEE Custom Integrated Circuits Conference, pp. 51-54.

* cited by examiner

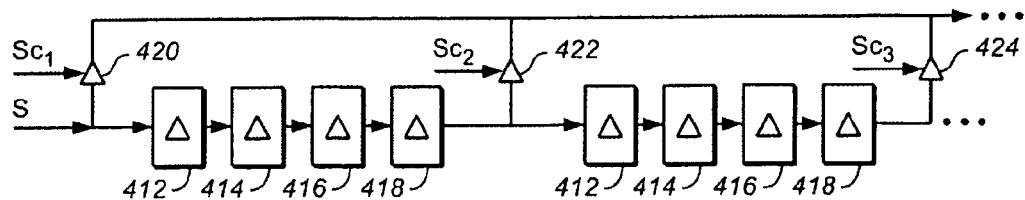
FIG._4
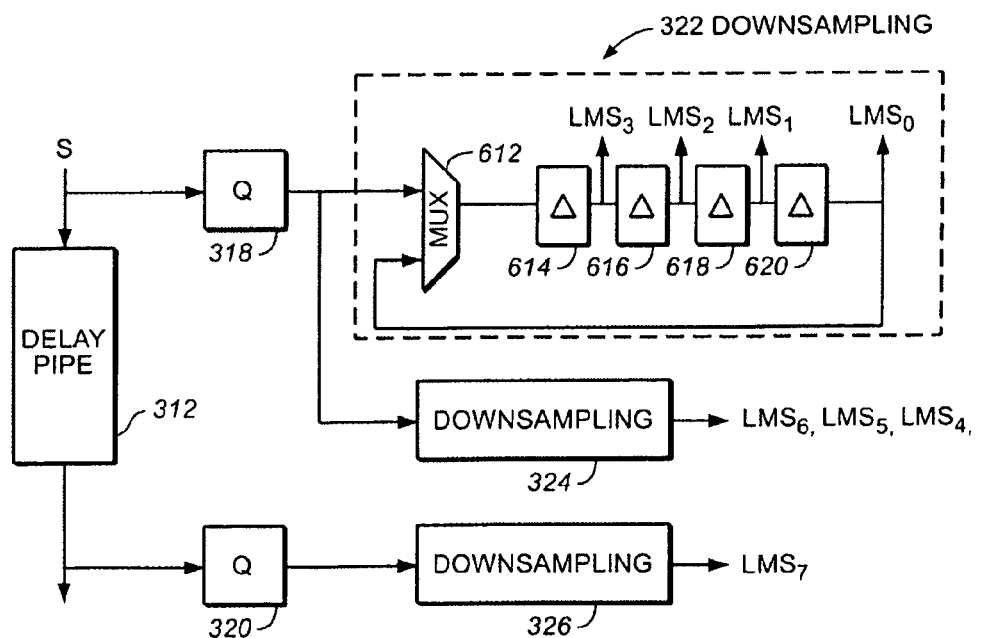
FIG._6

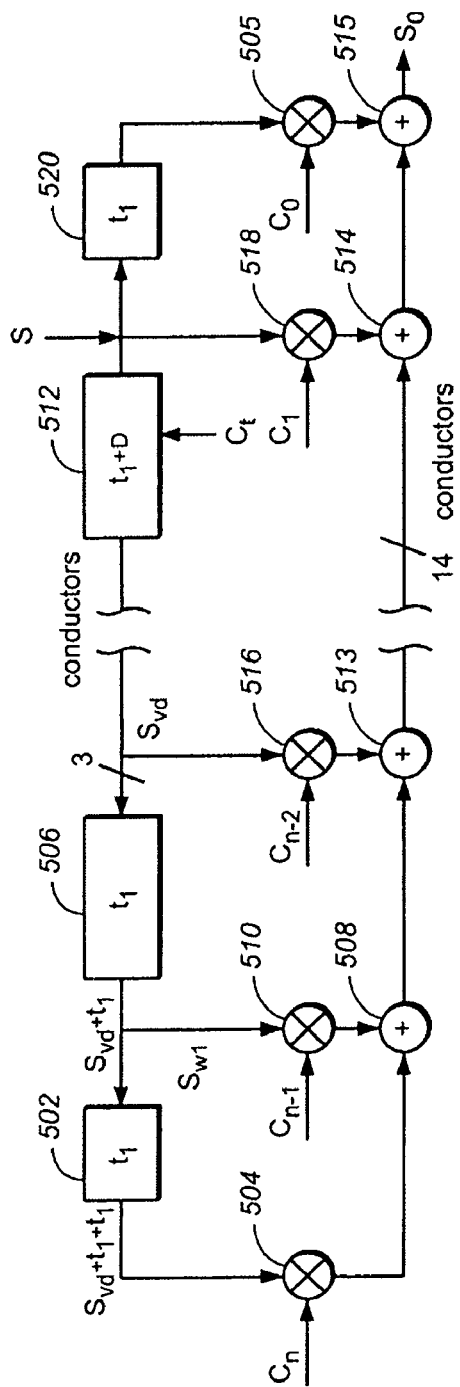
FIG. _5A
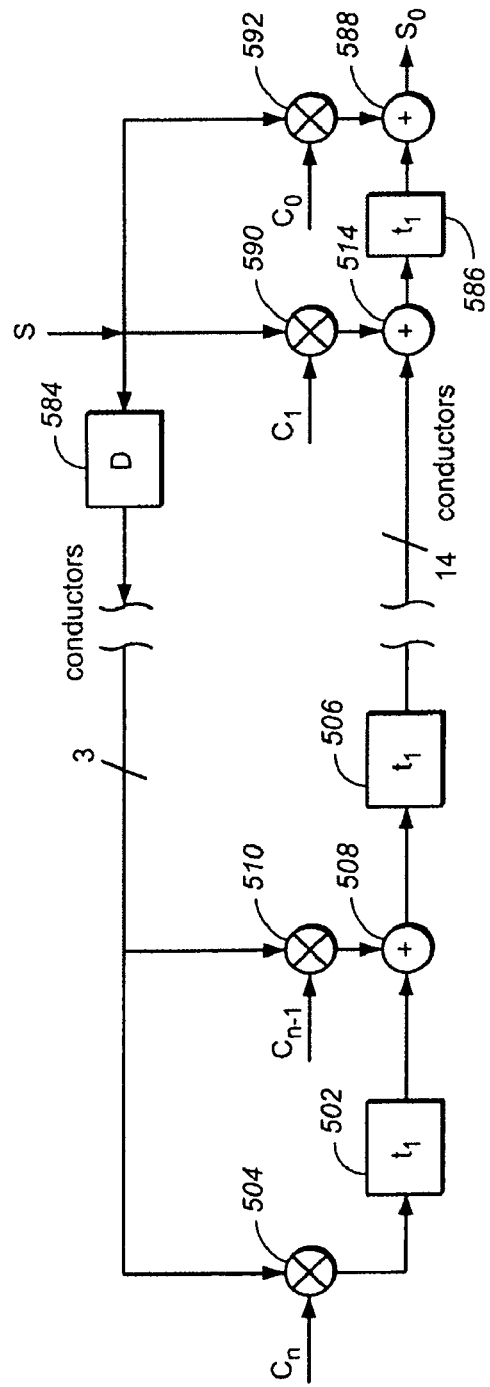
FIG. _5B

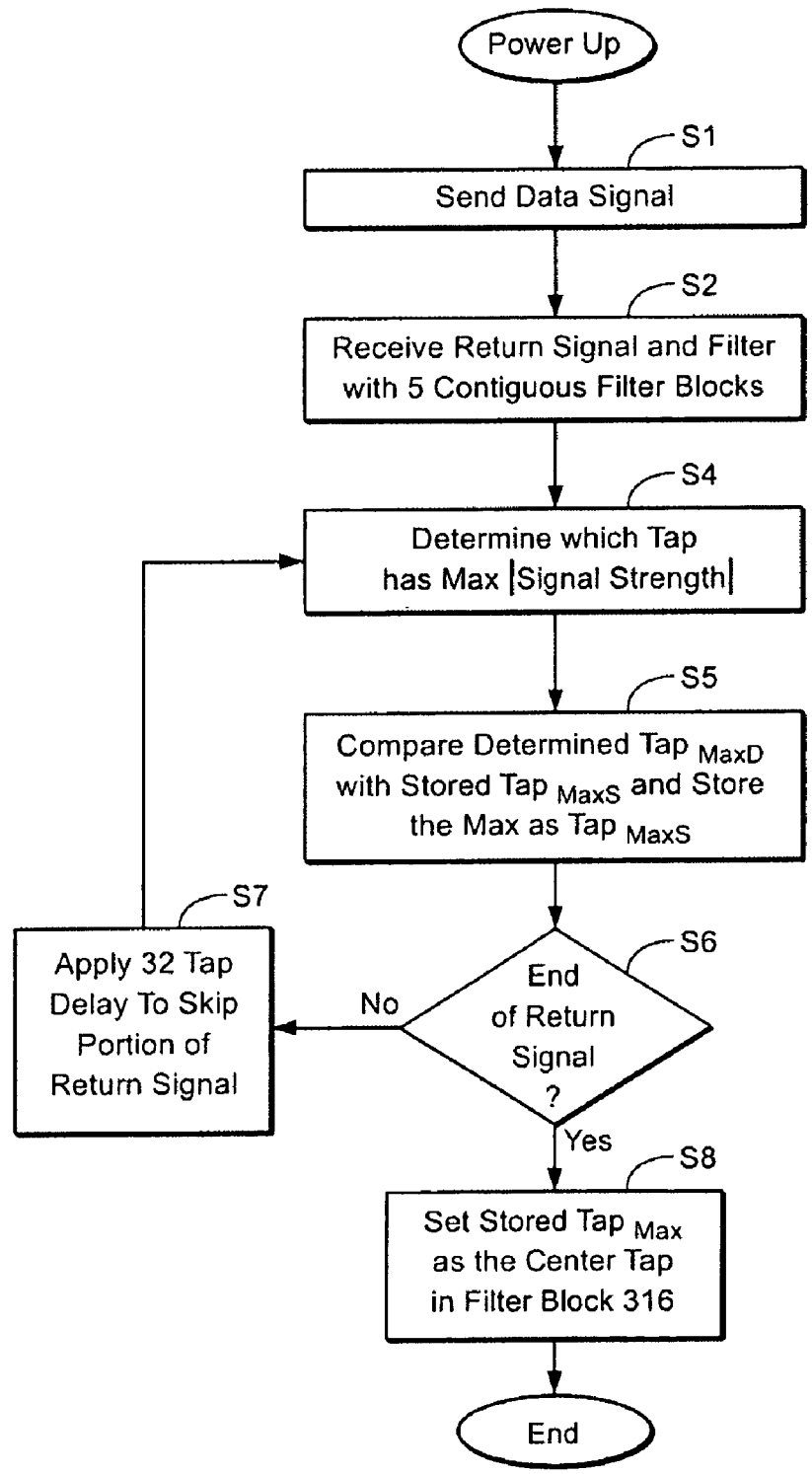
FIG._7

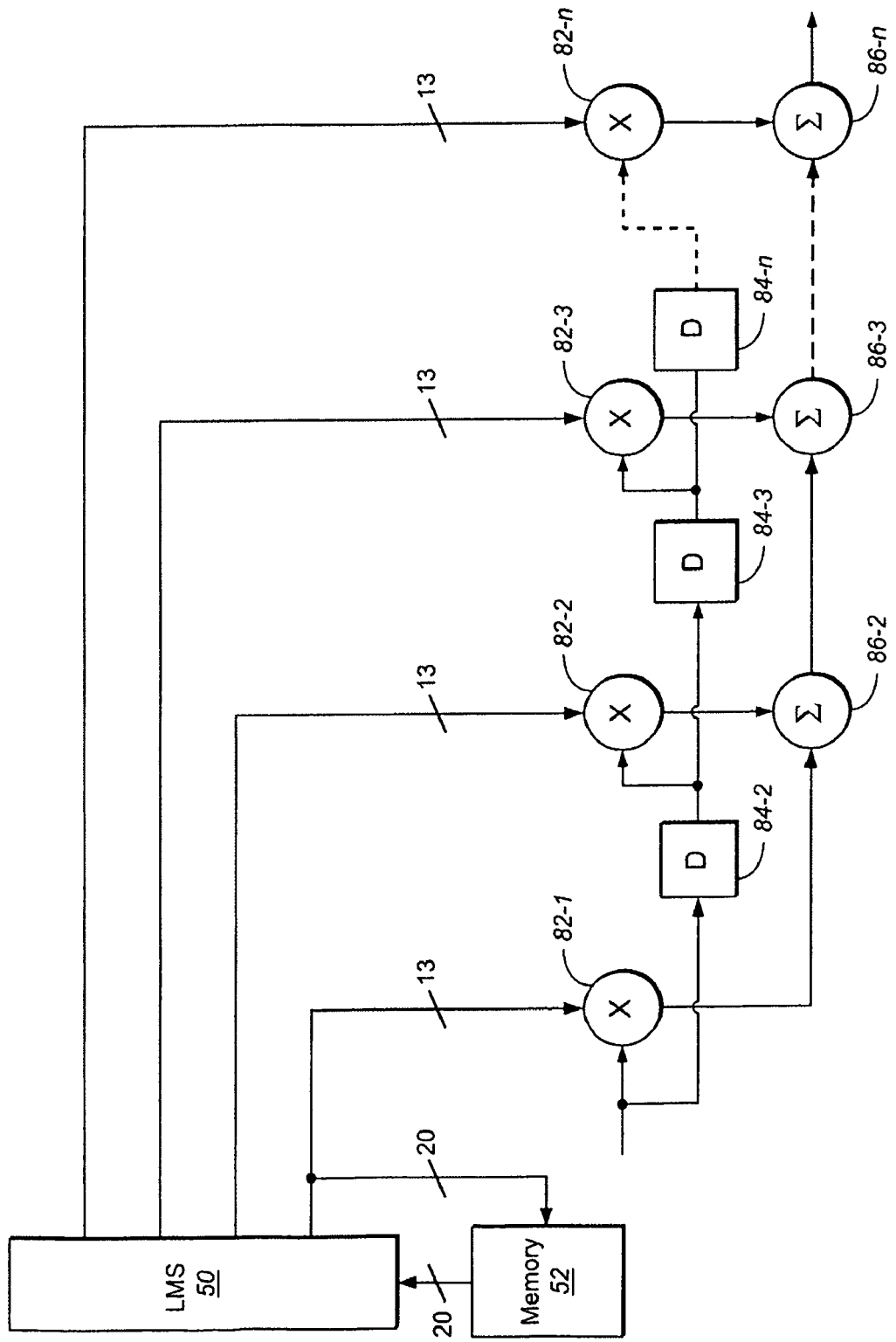
FIG._8

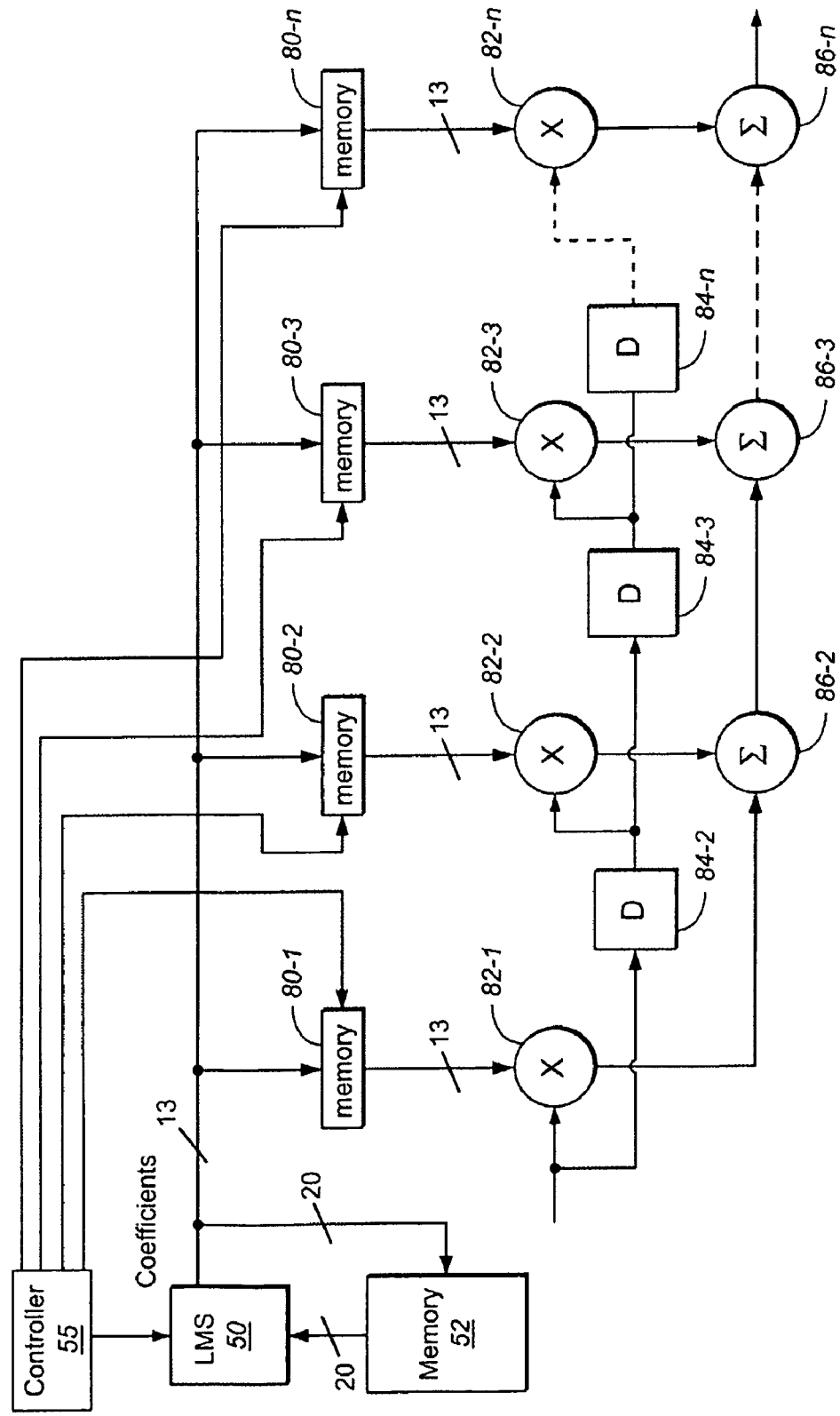
FIG._9

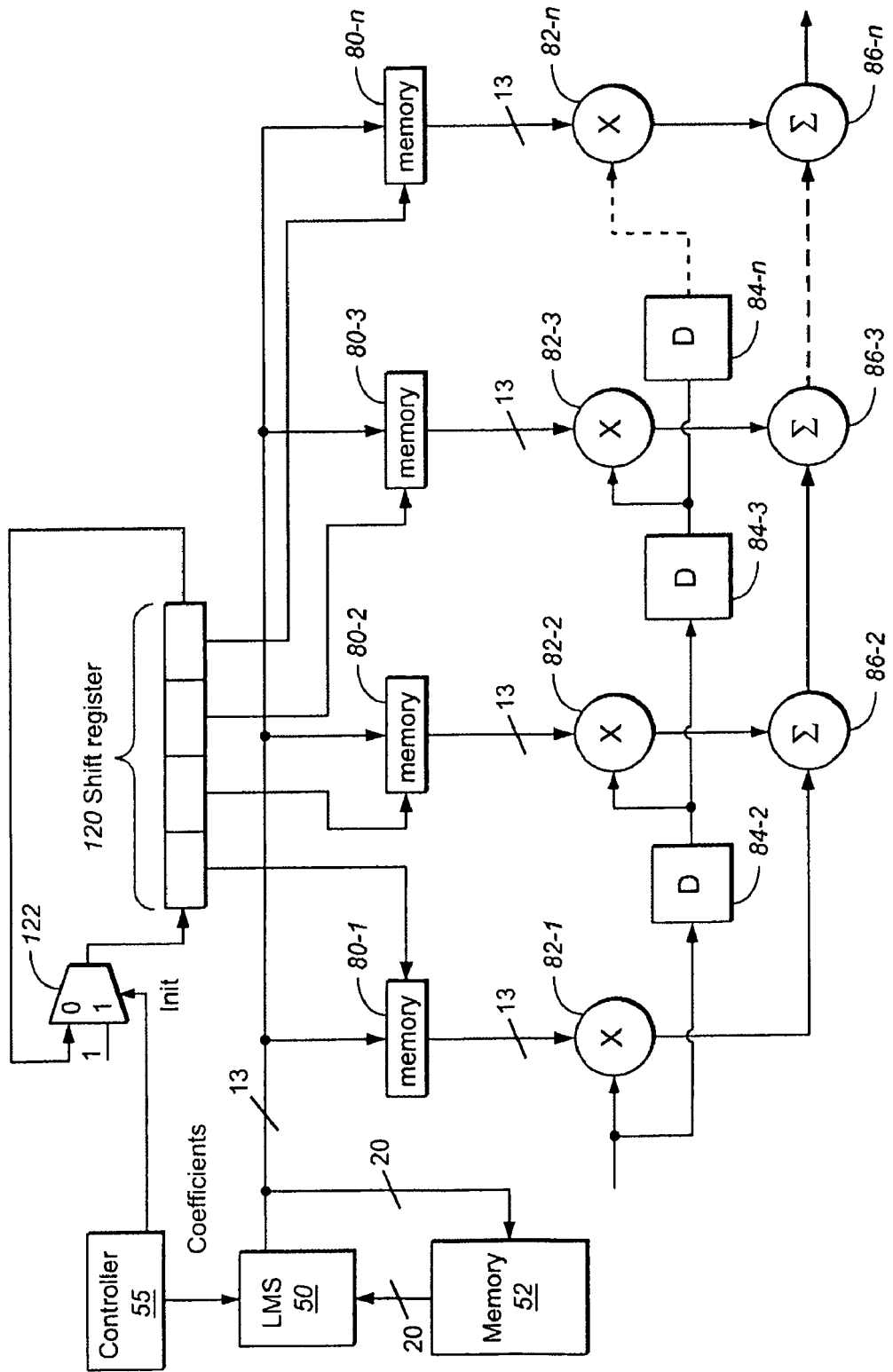
FIG._10

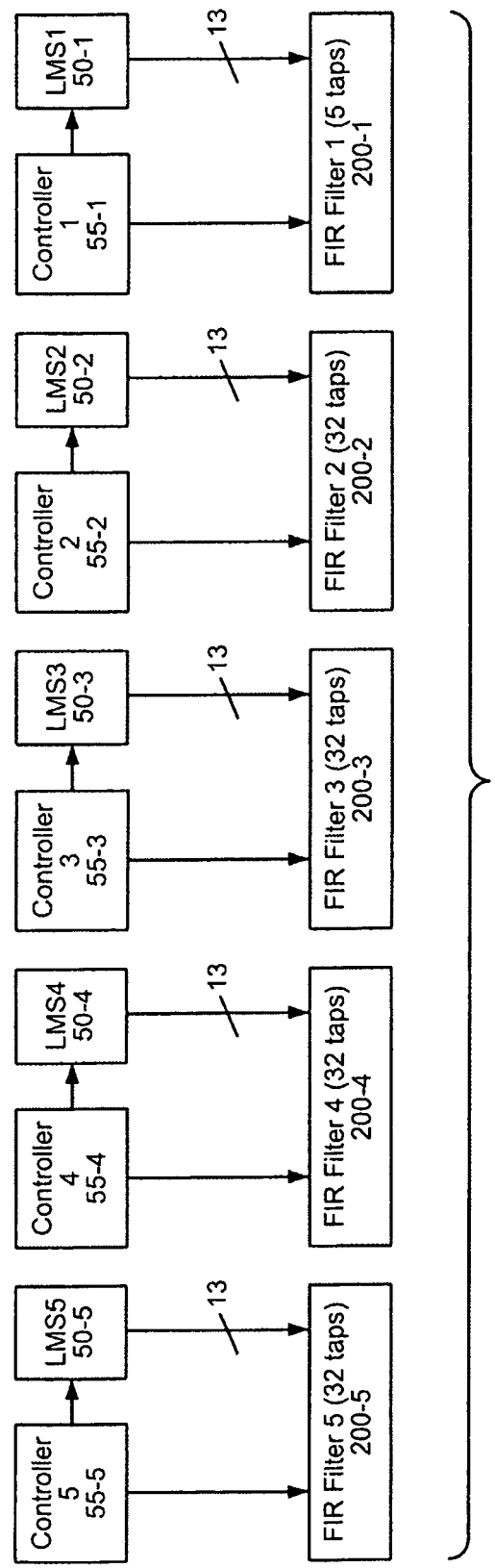
FIG._11

MOVABLE TAP FINITE IMPULSE RESPONSE FILTER

CROSS-REFERENCE TO RELATED APPLICATIONS

This application is a Divisional of U.S. patent application Ser. No. 09/678,728, filed on Oct. 4, 2000 and entitled "Movable Tap Finite Impulse Response Filter", the contents of which are incorporated herein by reference.

BACKGROUND OF THE INVENTION

1. Field of the Invention

The present invention relates to a finite impulse response filter, and particularly to such a filter in which a delay in a portion thereof has an adjustable or selectable delay period, and to an echo canceller and an Ethernet transceiver including such an FIR filter.

2. Description of the Related Art

Finite impulse response (FIR) filters are extremely versatile digital signal processors that are used to shape and otherwise to filter an input signal so as to obtain an output signal with desired characteristics. FIR filters may be used in such diverse fields as Ethernet transceivers, read circuits for disk drives, ghost cancellation in broadcast and cable TV transmission, channel equalization for communication in magnetic recording, echo cancellation, estimation/prediction for speech processing, adaptive noise cancellation, etc. For example, see U.S. Pat. Nos. 5,535,150; 5,777,910; and 6,035,320, the contents of each of which are incorporated herein by reference. Reference is also made to the following publications: "An adaptive Multiple Echo Canceller for Slowly Time Varying Echo Paths," by Yip and Etter, IEEE Transactions on Communications, October 1990; "Digital Signal Processing", Alan V. Oppenheim, et al., pp. 155-163; AA 100 MHz Output Rate Analog-to-Digital Interface for PRML Magnetic-Disk Read Channels in 1.2 um CMOS@, Gregory T. Uehara and Paul R. Gray, ISSCC94/Session 17/Disk-Drive Electronics/Paper FA 17.3, 1994 IEEE International Solid-State Circuits Conference, pp. 280-281; "72 Mb/S PRML Disk-Drive Channel Chip with an Analog Sampled Data Signal Processor", Richard G. Yamasaki, et al., ISSCC94/Session 17/Disk-Drive Electronics/Paper FA 17.2, 1994 IEEE International Solid-State Circuits Conference, pp. 278, 279; "A Discrete-Time Analog Signal Processor for Disk Read Channels", Ramon Gomez, et al., ISSCC 93/Session 13/Hard Disk and Tape Drives/Paper FA 13.1, 1993

ISSCC Slide Supplement, pp. 162, 163, 279, 280; and AA 50 MHz 70 mW 8-Tap Adaptive EqualizerNiterbi Sequence Detector in 1.2 um CMOS@, Gregory T. Uehara, et al. 1994 IEEE Custom Integrated Circuits Conference, pp. 51-54, the contents of each being incorporated herein by reference.

Typically, an FIR filter is constructed in multiple stages, with each stage including an input, a multiplier for multiplication of the input signal by a coefficient, and a summer for summing the multiplication result with the output from an adjacent stage. The coefficients are selected by the designer so as to achieve the filtering and output characteristics desired in the output signal. These coefficients (or filter tap weights) are often varied, and can be determined from a least mean square (LMS) algorithm based on gradient optimization. The input signal is a discrete time sequence which may be analog or digital, while the output is also a discrete time sequence which is the convolution of the input sequence and the filter impulse response, as determined by the coefficients.

With such a construction, it can be shown mathematically and experimentally that virtually any linear system response can be modeled as an FIR response, as long as sufficient stages are provided. Because of this feature, and the high stability of FIR filters, such filters have found widespread popularity and are used extensively.

One problem inherent in FIR filters is that each stage requires a finite area on an integrated circuit chip. Additional area is required for access to an external pin so as to supply the multiplication or weighting coefficient for that stage. In some environments, the number of stages needed to provide desired output characteristics is large. For example, in Gigabit Ethernet applications it is preferred that every 8 meters of cable length be provided with 11 stages of FIR filter. In order to cover cable lengths as long as 160 meters, 220 FIR stages should be provided. In such environments, chip area on the integrated circuit is largely monopolized by the FIR stages.

Moreover, each FIR stage requires a finite amount of power and generates a corresponding amount of heat. Particularly where a large number of stages is needed, such power requirements become excessive and require significant mechanical adaptations to dissipate the heat.

The inventors herein have recently recognized that in some environments, not all stages of an FIR contribute significantly to the output. FIG. 1, for example, is a waveform showing signal amplitude versus time in an Ethernet echo cancellation application, where time (on the horizontal axis) is expressed in delay units for an FIR filter. The waveform shown in FIG. 1 represents an Ethernet transmission and its echo (or, reflection). As seen in FIG. 1, the waveform includes the near end echo at region 1, followed by a relatively quiet period in region 2, a relatively negligible signal at region 3, and the far end echo at region 4. One use of an FIR filter in such an Ethernet environment is to cancel the echo so as to distinguish more clearly between incoming signals and simple reflections of transmitted signals. However, the relatively negligible signal at region 3 contributes very little to the overall output of the FIR filter. The reason for this is that, whatever value of coefficients are set at the stages corresponding to region 3, those coefficients will be multiplied by a value which is approximately zero. Thus, contributions of those signals to the FIR output will be negligible, especially compared to regions 1, 2 or 4.

The inventors have considered simplifying the selection of coefficients by setting the coefficients corresponding to region 3 to zero, which would result in simpler algorithms needed to select coefficients. However, even with zeroed coefficients, the stages corresponding to region 3 still exist on the integrated circuit chip, stealing valuable surface area and power, and generating unwanted heat.

SUMMARY OF THE INVENTION

A finite impulse response (FIR) filter comprises a first multiplier that receives an input signal and a first tap coefficient. A first delay element receives the input signal and provides a fixed delay. A second multiplier receives a second tap coefficient and an output of the first delay element. A variable delay element receives the input signal and provides a variable delay. M delay elements provide the fixed delay. A first one of the M delay elements receives an output of the variable delay element and remaining ones of the M delay elements receive an output of a preceding one of the M delay elements, where M is an integer greater than one. M multipliers receive outputs of respective ones of the M delay elements and respective ones of M tap coefficients. A plurality of summers sum outputs of the first, second and M multipliers.

A finite impulse response (FIR) filter comprises an input for receiving an input signal. A first plurality of stages receives a predetermined first portion of the input signal. A delay element providing a variable delay. A second plurality of stages receives a second portion of the input signal delayed by the variable delay.

A finite impulse response (FIR) filter comprises a first multiplier that receives an input signal and a first tap coefficient. A second multiplier receives the input signal and a second tap coefficient. A first summer receives an output of the first multiplier. A first delay element receives an output of the first summer and that provides a fixed delay. A second summer receives an output of the second multiplier and the first delay element. A variable delay element receives the input signal and that provides a variable delay. M multipliers receive the input signal with the variable delay and respective ones of M tap coefficients, where M is an integer greater than one. A first one of M delay elements receives an output of a first one of the M multipliers. (M−1) summers, wherein a first one of the M−1 summers receives an output of the a first one of the M delay elements and one of the M multipliers. (M−1) other ones of the M delay elements receive outputs of respective ones of the M−1 summers. The first summer receives an output of an Mth one of the M delay elements.

This brief summary has been provided so that the nature of the invention may be understood quickly. A more complete understanding of the invention can be obtained by reference to the following detailed description of the preferred embodiments in connection with the attached drawings.

BRIEF DESCRIPTION OF THE DRAWINGS

FIG. 4 is a functional block diagram of the 64-delay pipe shown in FIG. 3.

FIGS. 5a and 5b are functional block diagrams showing the FIR filter of FIG. 3.

FIG. 6 is a functional block diagram showing the quantizer and downsampling blocks of the FIR filter of FIG. 3.

FIG. 7 is a flowchart depicting a method of determining how much delay should be provided to the input signal in accordance with the present invention.

FIG. 8 is a functional block diagram showing a conventional FIR filter.

FIG. 9 is a functional block diagram showing a FIR filter in accordance with a second embodiment of the present invention.

FIG. 10 is a functional block diagram showing a FIR filter in accordance with a third embodiment of the present invention.

FIG. 11 is a functional block diagram showing an alternate configuration of an FIR filter in accordance with the third embodiment of the present invention.

DETAILED DESCRIPTION OF THE PRESENTLY PREFERRED EMBODIMENTS

First Embodiment

The present invention will now be described with reference with to an echo canceller used in an Ethernet transceiver device. Preferably, the echo canceller is embodied in an Integrated Circuit disposed between a digital interface and an RJ45 analog jack. The Integrated Circuit may be installed inside a PC on the network interface card or the motherboard, or may be installed inside a network switch or router. However, other embodiments include applications in read circuits for disk drives, ghost cancellation in broadcast and cable TV transmission, channel equalization for communication in magnetic recording, echo cancellation, estimation/prediction for speech processing, adaptive noise cancellation, etc. All such embodiments are included within the scope of the appended claims.

While the present invention is described with respect to a digital FIR filter, is to be understood that the structure and functions described herein are equally applicable to an analog FIR. Moreover, while the invention will be described with respect to the functional elements of the FIR filter, the person of ordinary skill in the art will be able to embody such functions in discrete digital or analog circuitry, or as software executed by a general purpose process (CPU) or digital signal processor.

Figure 2:
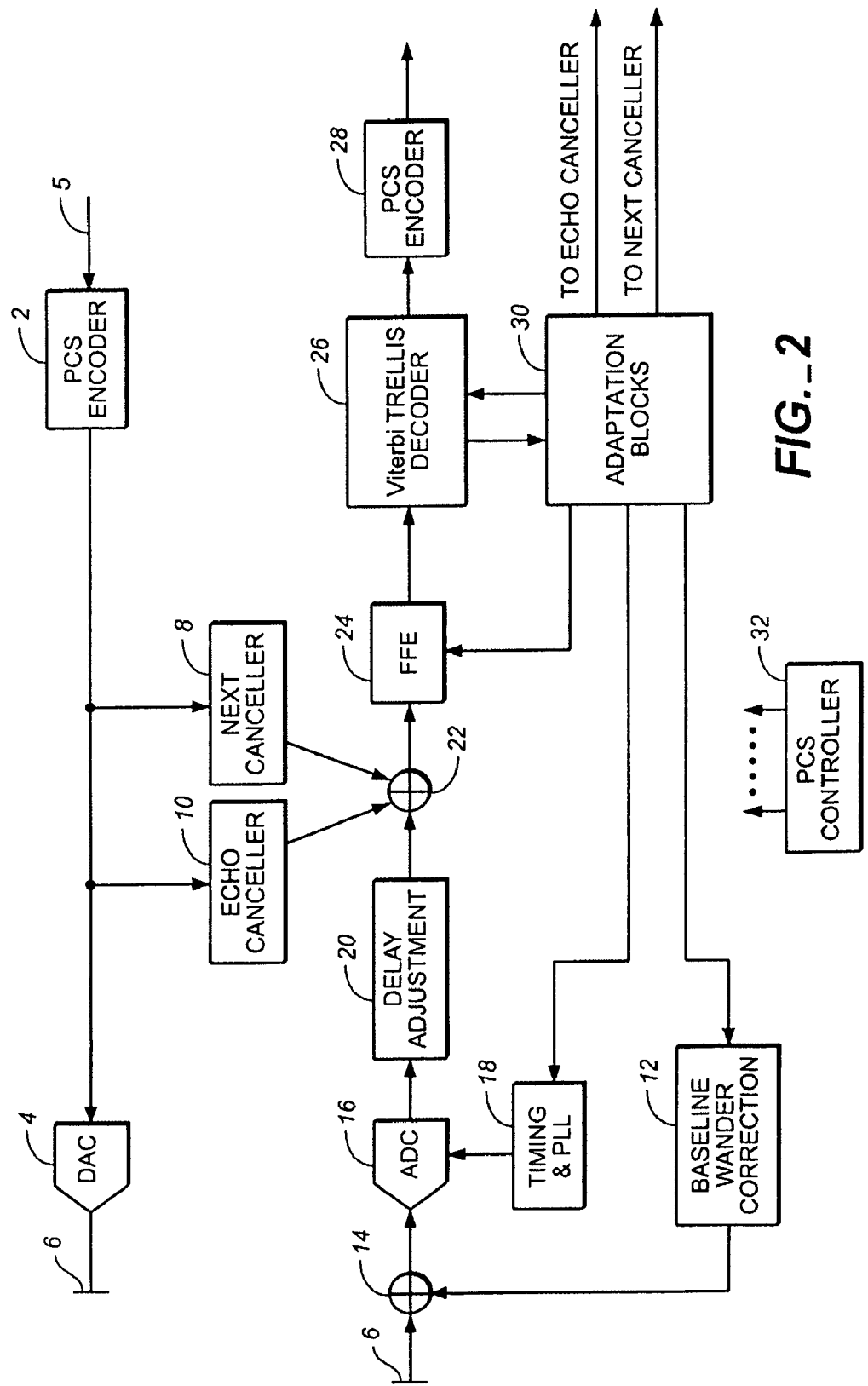
FIG. 2 is a functional block diagram showing an Ethernet transceiver including a transmit side and a receive side, and in which an echo canceller thereof includes an FIR filter according to the invention.

A functional block diagram of an Ethernet transceiver incorporating an FIR filter according to the present invention is depicted in FIG. 2. Although only one channel is depicted therein, four parallel channels are typically used in Gigabit Ethernet applications. Only one channel is depicted and described herein for clarity.

A 125 MHz, 250 Mbps digital input signal from a PC is PCS-encoded in a PCS encoder 2 and is then supplied to a D/A converter 4 for transmission to the Ethernet cable 6. The PCS-encoded signal is also supplied to a NEXT (Near End Transmitter) noise canceller 8 and to adaptive echo canceller 10. The operation of the echo canceller 10 will be described later herein with respect to FIG. 3.

Signals from the Ethernet cable 6 are received at adder 14 and added with correction signals supplied from baseline wander correction block 12 (which corrects for DC offset). The added signals are then converted to digital signals in the A/D converter 16, as controlled by timing and phase-lock-loop block 18. The digital signals from A/D converter 16 are supplied to delay adjustment block 20, which synchronizes the signals in accordance with the four parallel Ethernet channels. The delay-adjusted digital signals are then added with the echo-canceled signals and the NEXT-canceled signals in adder 22.

The added signals are supplied to a Feed Forward Equalizer filter 24 which filters the signal prior to Viterbi trellis decoding in decoder 26. After Viterbi decoding, the output signal is supplied to PCS decoder 28, after which the PCS-decoded signal is supplied to the PC.

The decoder 26 also supplies output signals to a plurality of adaptation blocks schematically depicted at 30 in FIG. 2. As is known, such adaptation blocks carry out corrections for such conditions as temperature offset, connector mismatch, etc. The adaptation block 30 provides output to the baseline wander correction circuit 12, the timing and phase-lock-loop circuit 18, the echo canceller 10, and the NEXT canceller 8.

Each functional block depicted in FIG. 2 includes a slave state controller (not shown) for controlling the operation and timing of the corresponding block. A PCS controller 32 controls the slave state controllers of all elements depicted in FIG. 2, in a manner to be described below.

Figure 3:
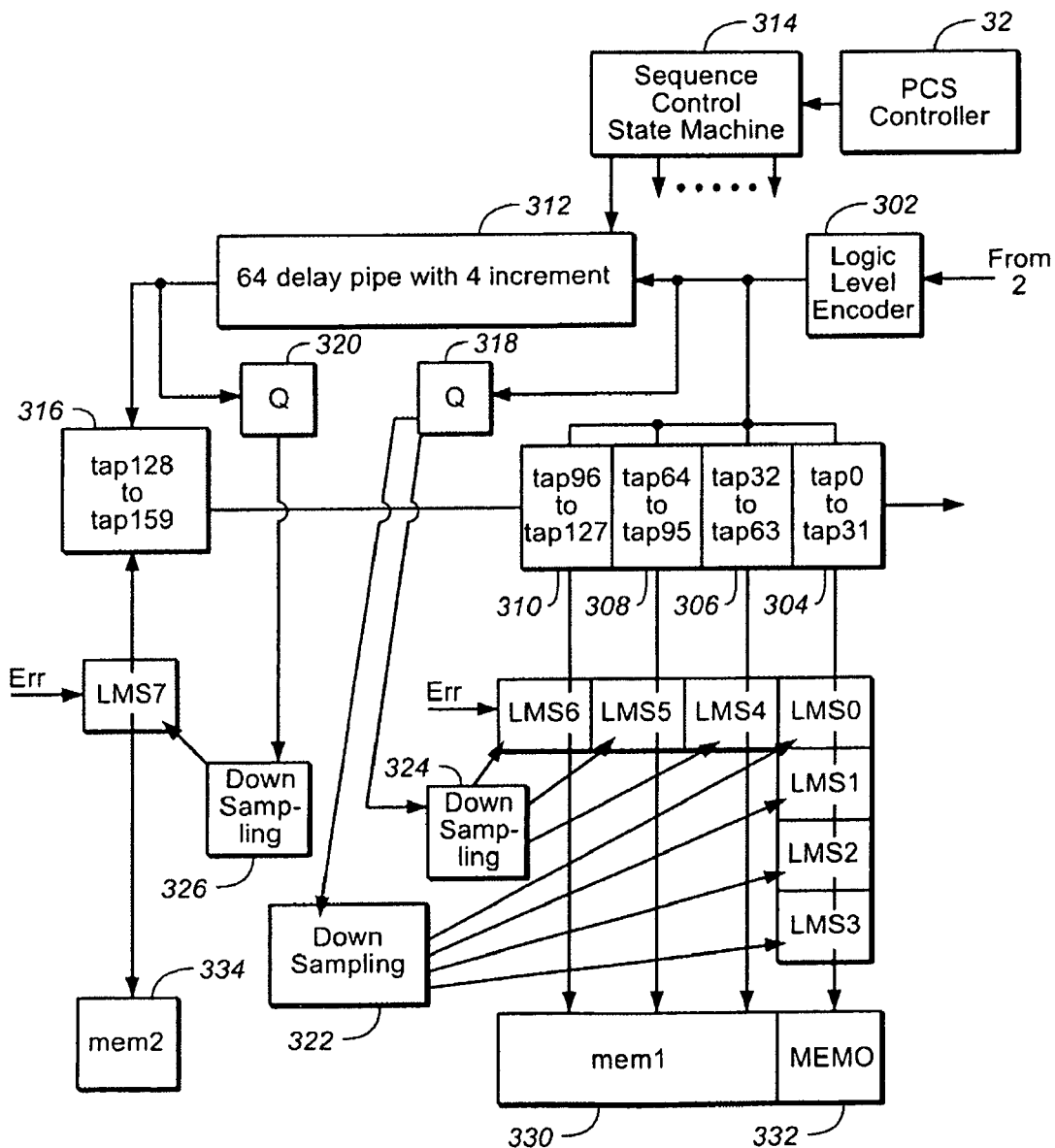
FIG. 3 is a functional block diagram of the echo canceller in FIG. 2, showing an FIR filter according to the invention together with least mean square elements by which the coefficient for each stage is generated, and including an adjustable delay element.

FIG. 3 is a functional block diagram of the echo canceller 10 shown in FIG. 2. In FIG. 3, the PCS-encoded logic signal is provided to logic encoder 302 as a five level logic signal (e.g. −1, −0.5, 0, +0.5, +1). The encoder 302 encodes the signal as 3 control bits, which correspond to the five logic levels of the PCS-encoded signal (e.g. −1=100; −0.5=101; 0=010; 0.5=001; 1=000). These control bits are supplied to a first plurality or block of filter stages 304 (comprising taps 0 to 31 of the FIR filter), a second plurality or block of filter stages 306 (comprising taps 32 to 63), a third plurality or block of filter stages 308 (comprising taps 64 to 95), and a fourth plurality or block of filter stages 310 (comprising taps 96 to 127).

Figure 1:
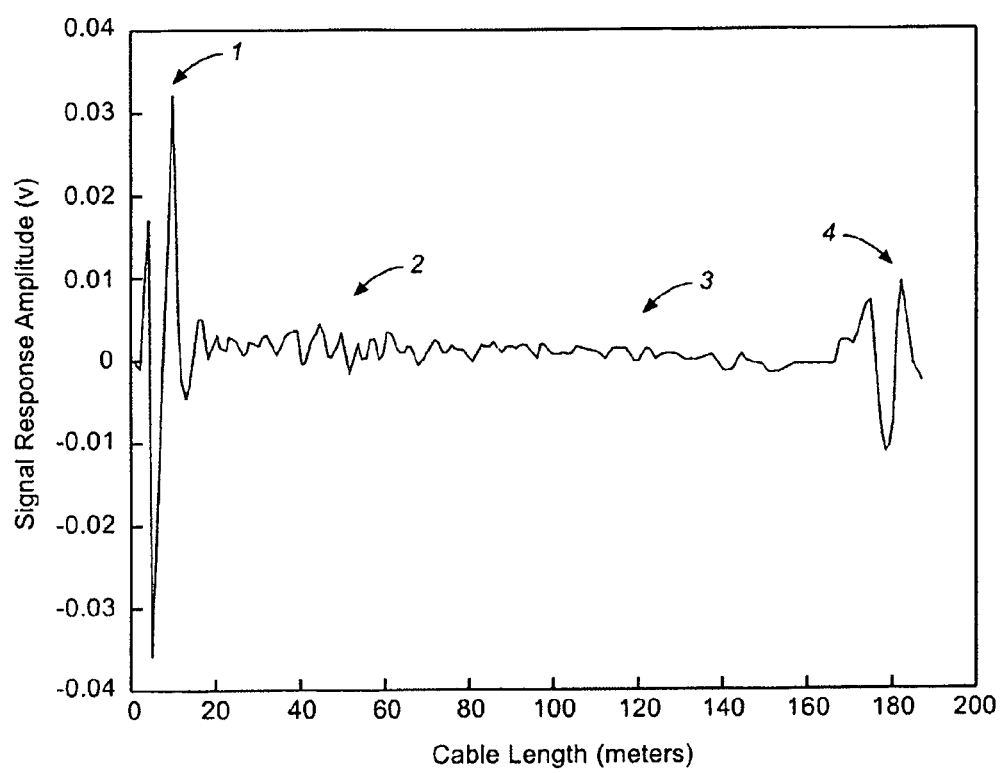
FIG. 1 is a view showing a channel response waveform over copper cable in an Ethernet environment, including near end echo and far end echo due to reflection.

Filter blocks 304, 306, 308, and 310 typically have fixed delay periods between each of the taps for constant sampling of the early regions of the input signal where significant signal strength is present. Referring to FIG. 1, large amplitudes are present in regions 1 and 2 of the input signal, and (according to the present embodiment) the blocks 304, 306, 308, and 310 receive these regions of the input signal to insure filtering of these significant portions of the signal. A more detailed description of the filter blocks will be provided later herein.

The logic-level-encoded signal from encoder 302 is also supplied to a 64-delay pipe (with 4 increment) 312. The delay pipe 312 is controlled by the echo controller's sequence control state machine 314 so that the portion of the input signal having the most significant echo noise is supplied to filter block 316 for noise cancellation. That is, the region 3 of the input signal is delayed appropriately in delay pipe 64 so that region number 3 is not subjected to echo cancellation (it is "skipped over") until portion 4 can be received and input into filter block 316. This way, not the entire input signal is FIR-filtered, and not as many taps are needed to effectively cancel the echo in the input signal. The method by which the signal is selectively delayed will be described in more detail below.

The output of the logic level encoder 302 is also supplied to a quantizer 318 which encodes the three control bits into two logic bits for application to downsampling blocks 322 and 324 (to be described below). For example, the quantizer 318 encodes 000 as 00; 001 as 00; 010 as 10; 101 as 01; and 100 as 01. The quantizer 318 thus performs a rounding function so that the encoded signal may be used to control the least mean squares (LMS) engines 0 through 6.

The LMS engines 4, 5, and 6 are designed to supply tap weighting coefficients to a single block of 32 FIR filter taps, and thus downsampling block 324 can use the same quantizer data for 32 cycles. In contrast, and in accordance with the present invention, LMS engines 0, 1, 2, and 3 are designed to supply tap weighting coefficients to taps 0 to 31 of filter block 304, and downsampling block 322 controls each of these LMS engines in a time-cyclic fashion. This architecture allows more precise filtering of the early regions of the input signal having significant signal strength. For example, at time t1, LMS engine 0 supplies a weighting coefficient to tap 0, LMS engine 1 supplies a weighting coefficient to tap 1, LMS engine 2 supplies a weighting coefficient to tap 2, and LMS engine 3 supplies a weighting coefficient to tap 3. At time t2, LMS engine 0 supplies a weighting coefficient to tap 1, LMS engine 1 supplies a weighting coefficient to tap 2, LMS engine 2 supplies a weighting coefficient to tap 6, and LMS engine 3 supplies a weighting coefficient to tap 4. In this cyclic fashion, LMS engines 0-3 supply weighting coefficients to more precisely filter the region 1 of the input signal, in contrast to the less precise filtering of the region 2 of the input signal filtered by filter blocks 306, 308, and 310. The above is described in more detail in commonly assigned U.S. patent application Ser. No. 09/465,228, filed Dec. 19, 1999 and entitled, "A Method and Apparatus for Digital Near-End Echo/Near-End Crosstalk Cancellation with Adaptive Correlation", the contents of which is incorporated herein by reference.

The quantizer 320 quantizes the output of the delay pipe 312 and supplies it to the downsampling block 324 in a manner similar to that described above with respect to quantizer 318. Downsampling block 326 then controls LMS engine 7 which supplies weighting coefficients to the taps 128 to 159 of the filter block 316 (which thus filters the adaptively delayed portion of the input signal).

The manner by which the LMS engines generate the tap coefficients will now be described. The LMS engines 0 to 7 input error signals from the FFE 24 or the Viterbi decoder 26 of FIG. 2. A memory 330 stores weighting coefficients for each of taps 32-127. As the error signal is received from the FFE 24 or the Viterbi decoder 26, the appropriate coefficients are extracted from memory 330, applied through the corresponding LMS engine, and provided to the appropriate taps 32-127 in order to filter the input signal to eliminate the echo noise in region 2 of the input signal.

In a manner similar to that described above, memory 332 stores coefficients for the taps 0-31 of the filter block 304. The appropriate coefficients are extracted from memory 332 and applied to the appropriate LMS engines 0-3 together with the error signal, and the appropriate coefficients are then supplied to the taps 0-31 to appropriately filter the echo noise in region 1 of the input signal. Similarly, the memory 334 stores coefficients for the taps 128-159, which are selectively applied to the LMS engine 7 together with the error signal. The appropriate tap coefficients are then applied to filter block 316.

FIG. 4 is a functional block diagram of the 64-delay element 312 of FIG. 3. As can be seen, the 64 delay elements are grouped in sets of four delay elements 412, 414, 416, and 418. The logic level-encoded signal S is input to the delay pipe and may be delayed in increments of four by activation of control signals at gates 420, 422, and 424. The control signals are supplied by the sequence control state machine 314, and are varied in accordance with which portion of the input signal is to be skipped, as will be described below.

FIG. 5a is a functional block diagram of the FIR filter showing how the variable delay D is supplied to an existing delay element 512 in order to variably adjust the input signal to skip the desired portion thereof. In FIG. 5a, the logic level-encoded signal S is supplied, for example, to a first element 520 having a time delay t1. A tap coefficient C0 is applied to a multiplier 505 in order to weight the first tap of the FIR filter. The weighted signal is then provided to a summer 515 where it is added to the outputs of the other stages (to be described below), and then output as signal So. The signal S is also supplied to the multiplier 518 for multiplication by coefficient C1, and addition with the other outputs at summer 514. Of course, any number of additional stages like 520 may be provided prior to the output, as required.

The input signal S is also supplied to delay element 512 having a variable delay D. The thus-delayed signal Svd is then provided to a series of sequential delay elements including delay element 506, which preferably also has a fixed delay time t1. The delayed signal Svd is also supplied to multiplier 516 for multiplication by coefficient $C_{n-2}$ and addition in summer 513, as shown. The output of delay element 506 Svd+t1 is supplied to both another delay element 502 (having a t1 delay) and a multiplier 510 where it is multiplied by coefficient Cn−1. The output of element 502 Svd+t1+t1 is supplied to multiplier 504 where it is multiplied by coefficient Cn and then added, in adder 508, to the output from multiplier 510. In this manner, the series of weighted tap coefficients and corresponding input signals are processed through the FIR filter, in a manner known to those of skill in the art.

The appropriate number of stages with corresponding delay elements are provided in order to properly filter the regions of the input signal having significant signal strength, such as regions 1 and 2 in FIG. 1. However, to skip those insignificant portions of the signal (such as region 3), the element 512 is provided with the variable delay D in accordance with control signal Ct supplied from the sequence control state machine 314. According to the present invention, the variable delay D may be selected to skip any portion of the input signal which is not to be filtered. Preferably, a later portion of the input signal will be filtered since significant echo typically resides therein. Accordingly, after element 512, any number of additional stages like elements 502 and 506 are provided, typically having the same fixed time delay t1. The number of additional stages after stage 512 may be varied to appropriately filter the echo regions of the input signal.

FIG. 5b shows an alternative wherein the delay element 584 is provided to the undelayed portion of the input signal S to skip portions thereof. Like reference numerals represent like structure. In FIG. 5b, the input signal S is supplied to both of multipliers 590 and 592 where it is respectively multiplied by coefficients C0 and C1. The delayed signal Svd output from element 584 is, after any number of intervening stages, supplied to both multipliers 510 and 504 where it is respectively multiplied by coefficients Cn−1 and Cn. The output of multiplier 504 is delayed in a delay element 502 having a t1 delay, and then supplied to adder 508 where it is added to the output from multiplier 510. The output of adder 508 is then supplied to a delay element 506 having a delay of t1, and the output of 506 is, in turn, provided (after any number of intermediate stages) to the adder 514 where it is added with the output of multiplier 590. The output of adder 514 is provided to a delay element 586 having a t1 delay. The output of the element 586 is added, in adder 588, to the output of multiplier 592, and the output of adder 588 is the output signal S0.

In a further alternative to the above arrangement, variable delays may be provided to more than one filter block. For example, filter block(s) 310 and/or 308 and/or 306 may also be supplied with variable delays so that any portions of the input signal may be skipped or filtered as the circuit designer requires. All such alternatives are included within the scope of the appended claims.

FIG. 6 is a functional block diagram of the quantizer and downsampling circuits of FIG. 3. The quantizer 318 receives the logic level-encoded signal S from the input of delay pipe 312. The output of quantizer 318 is provided to both the downsampling block 324 and a multiplexer 612. The multiplexer 612 outputs the quantizer signal to a one-cycle delay element 614, which supplies the down-sampled signal to LMS engine 3. In a similar manner, delay elements 616, 618, and 620 respectively provide down-sampled signals to LMS engines 2, 1, and 0, after the appropriate delay. The output of delay element 620 is also returned to the multiplexer 612, as shown.

The output of downsampling block 324 is provided to the LMS engines 6, 5, and 4, as was described above with reference to FIG. 3. Also, the output of the delay pipe 312 is supplied to the quantizer 320 which supplies the downsampling block 326 and LMS engine 7, as shown.

In operation, those portions of the input signal which may be skipped by the FIR filter must first be determined. Preferably, this is done by injecting a test signal into the Ethernet cable and then receiving the return signal, such as the waveform depicted in FIG. 1. However, the procedure for determining the insignificant portions of the input signal may be performed at any convenient time, such as when the Ethernet is first powered on, after any Ethernet device has been plugged into the network or unplugged from the network, during any lull in Ethernet communications, on a periodic basis, or continually. The signal used to determine the delay may also be any appropriate signal such as a test signal, a series of test signals, or by using actual Ethernet communication signals on-the-fly.

The method of determining how much delay to be supplied to the input signal in accordance with the embodiment of FIG. 3 will now be described with respect to the flow chart of FIG. 7. This process is preferably carried out within the sequence control state machine 314, although any convenient processor and memory may be used. In FIG. 7, when the Ethernet is first powered-up, data starts to be supplied to the Ethernet cable 6 at step S1. At step S2, the return signal is received and then filtered in the FIR filter using blocks 304, 306, 308, 310, and 316 contiguously so as to filter a continuous portion of the return signal. At step S4, it is determined which tap of taps 128-159 has received the maximum return signal strength. This tap is labeled tapmaxd. At step S5, tapmaxd is compared with the stored tapmaxs, and the tap having the maximum signal strength is then stored as the new tapmaxs. Of course, for the first determination, the initial tapmaxd will be stored as tapmaxs. In order to avoid storing unexpectedly large signal strength caused by noise, multiple looping for comparison is preferably employed. For example, if 32 taps are compared and tap 7 is identified as tapmaxs, the comparison will be repeated multiple times. Every comparison, tap 7 will be replaced with tapmacxs even though the tapmaxs is larger than tap 7, in order to avoid a lock up error.

At step S6, it is determined whether the end of the return signal has been reached. If the end of the return signal has not been reached, the process proceeds to step S7 where a 32 tap delay is applied to skip a portion of the return signal. Of course, any amount of tap delay (1 tap, 4 taps, 8 taps, 16 taps, 64 taps, etc.) may be used in any combination by the circuit designer to flexibly configure the FIR filter. The process then returns to step S4 to determine which tap of the newly-filtered signals has the maximum signal strength. Again, the determined tapmaxd is compared with the stored tapmaxs, and the maximum value is stored as the new tapmaxs in step S5.

One algorithm for performing steps S4, S5, S6, and S8 of FIG. 7 is as follows:

Let n=the number of stages in the FIR filter.

Let tap[i]=the ith stage of the FIR filter.

Let {tap[i]}=the coefficient value of the ith stage of the FIR filter.

Let Maxcoeff=the absolute value of the maximum coefficient value in the FIR filter.

Let m=the index of which tap coefficient is written into Maxcoeff.

At time=0,

Maxcoeff←{tap[0]} m·0

At time=i, (where i>0, i.e., 1, 2, 3, 4, . . . )

```
if (en_search)//where en_search enables the search for
Maxcoeff
  begin
  if (Maxcoeff<|{tap[i]}| or m=i)
  begin
  Maxcoeff←|{tap[i]}|
  m·I
  end
  else
  begin
  Maxcoeff·Maxcoeff
  m·m
  end
  end
  else
  begin
  Maxcoeff·Maxcoeff
  m·m
  end.
```

In this iterative manner, the last filter block 316 is successively moved across the later portions of the return signal identifying which portion(s) of the return signal have the maximum signal strength. When the filter block 316 has reached the end of the return signal, step S8 is performed wherein the stored tapmaxs is set as the center tap of the filter block 316. Now, the filter block 316 will be applied to the center of the later portion of the return signal having the most significant signal strength. The required delay may be determined algorithmically or from accessing an entry from a lookup table. The delay required to so-position filter block 316 is then stored in the memory of sequence control state machine 314 so that all Ethernet signals received from the Ethernet cable 6 may be FIR-filtered in accordance with the thus-configured filter blocks to skip those portions of the signal having insignificant signal strength, while filtering the remaining signal. In such a manner, Ethernet signals typically requiring more than 220 taps for proper FIR filtration can be adequately filtered with an FIR filter having only 160 taps.

Thus, what has been described is method and apparatus for controlling an FIR filter so as to delay the input signal to skip over portions of that signal having insignificant signal strength. This allows the FIR filter to have fewer taps, consuming less power and less space on the Integrated Circuit.

The individual components shown in outline or designated by blocks in the attached Drawings are all well-known in the FIR filtering arts, and their specific construction and operation are not critical to the operation or best mode for carrying out the invention.

Second Embodiment

FIG. 8 is a block diagram of a conventional FIR filter. As shown therein, input data is applied to one input of multiplier 82-1 to be multiplied by a first coefficient supplied from coefficient generator or preferably LMS engine 50. The input is applied to delay circuit 84-2 of the next stage and the output of multiplier 82-1 is supplied adder 86-2. The output of delay circuit 84-2 is applied to one input of multiplier 82-2 and to delay circuit 84-3 of the next stage. Multiplier 82-2 multiplies the output of delay circuit 84-2 by a second coefficient, which is also supplied by LMS engine 50. The coefficients supplied to their respective multipliers each contain a plurality of bits. In the preferred embodiment of the present invention each coefficient is 13 bits. LMS engine 52 supplies the coefficients to the multipliers by respective wirings. In the preferred embodiment each coefficient requires 13 conductors per wiring or a total of 2080 conductors for 160 taps. LMS engine 50 also supplies the coefficients to memory 52 at a higher resolution, which in the preferred embodiment is 20 bits. An output of memory 52 is fed back to LMS engine 50 for further calculations. The output of multiplier 82-1 is added to the output of multiplier 82-2 by adder 86-2. The succeeding stages are similarly configured. An FIR filter having 2080 conductors is more complex and consumes a significant amount of area which results in a larger die size.

FIG. 9 is a block diagram of the FIR filter in accordance with the second embodiment of the present invention. The second embodiment overcomes the above-discussed problem by sharing the wirings for all the coefficients supplied from LMS engine 50 to its corresponding tap of the FIR filter. Wirings are formed from a conductive material, such as by way of example aluminum, copper, polysilicon and the like. Referring to FIG. 9, LMS 50 supplies each of the coefficients via a shared or common set of wirings to a respective memory (80-1 ... 80$n$) for each corresponding tap. LMS engine 50 and memories (80-1 ... 80-$n$) are under the control of controller 55. Memories 80-1.80$n$ are preferably implemented as latches. As would be appreciated by one of ordinary skill in the art, other appropriate circuitry may be utilized, such as flip-flops, SRAM, DRAM, and the like. Controller 55 sequentially selects the coefficient to be provided by LMS engine 50 and a respective memory (80-1 ... 80-$n$) to store the coefficient. The stored coefficient is then provided to a corresponding multiplier (82-1 ... 82-$n$) to perform the multiplication operation. As used herein for this embodiment, the term LMS engine shall include individual LMS circuits to generate coefficients for each tap or an LMS circuit to generate coefficients for a group of taps, or any combination thereof. In the preferred embodiment the coefficient wiring requires 13 conductors and the number of taps is 160. Therefore the second embodiment of the present invention requires 13 conductors for the shared coefficient wiring and one control conductor for each tap or 160 conductors. In other words in the preferred embodiment 173 conductors are required. The delay times of delay circuits 84-2 ... 84-$n$ may be equal or some of the delay circuits may set to different values in accordance with the first embodiment of the present invention.

Third Embodiment

Reference is now made to FIG. 10, which illustrates a block diagram of the third embodiment in accordance with the present invention. As shown therein, the third embodiment is similar to the second embodiment except the third embodiment comprises a selector circuit (which is comprised by a combination shift register 120 and multiplexer 122) to locally generate the control signals for controlling the memories 80-1 ... 80-$n$ in synchronization with the coefficients output by LMS engine 50. The number of registers in shift register 120 equals the number of taps. In the preferred embodiment there are 160 taps and 160 registers in shift register 120. The operation of the third embodiment is as follows. Controller 50 generates an initialization signal for LMS engine 50 and multiplexer 122. At that time LMS engine 50 outputs a first coefficient and at each subsequent clock signal outputs a successive coefficient. Upon receiving the initialization signal, multiplexer 122 selects the first input (value=1) and loads the "1" into the first register of shift register 120. The first register corresponds to memory 82-1 of the first tap, and the first coefficient is stored therein. In response to the clock signal, the "1" is shifted in shift register 122, so that subsequent memories are enabled in synchronization when its corresponding coefficient is output by LMS engine 50. In the third embodiment, the number of conductors is equal to the width of the shared coefficient and one conductor for the initialization signal from controller 55. In the third embodiment the number of conductors is 13+1 or 14.

FIG. 11 shows an arrangement in which one LMS engine is provided for each 32 taps of the FIR filter. More specifically, the FIR filter comprises five FIR filter sections 200-1 . . . 200-5, each having 32 taps. The coefficients of FIR filter sections 200-1 . . . 200-5 are supplied from LMS engines 50-1 . . . 50-5. As can be seen from FIG. 11, each FIR filter sections requires 14 conductors (13 conductors from LMS engine 50-*n* and one from controller 55-*n*). Thus an FIR filter having 160 taps arranged in five FIR filter sections requires 70 conducts.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for selecting a period of delay in an FIR filter having (i) a plurality of delay elements and (ii) a plurality of coefficient taps each associated with a portion of an input signal in corresponding stages of delay from a corresponding delay element, in which at least one delay element has a period of delay that is selectable, the method comprising:

measuring components of an input signal so as to identify a sequence of components that are smaller than another sequence of larger components; and setting the selectable period of delay to prevent application of the identified sequence of smaller components of the input signal to the coefficient taps of the FIR filter.

2. A method according to claim 1, further comprising transmitting a test signal, wherein the input signal comprises an echo of the test signal.

3. A method according to claim 1, wherein said measuring and setting are applied iteratively with a different setting for the selectable period of delay so as to identify the sequence of smaller components.

4. A method comprising:

selecting a period of delay in an FIR filter having (i) a plurality of delay elements and (ii) a plurality of coefficient taps each associated with a portion of an input signal in corresponding stages of delay from a corresponding delay element;

providing at least one delay element that has a period of delay that is selectable;

measuring components of an input signal to identify a sequence of components that are smaller than another sequence of larger components; and setting the selectable period of delay to prevent application of the identified sequence of smaller components of the input signal to the coefficient taps of the FIR filter.

5. A method according to claim 4, further comprising transmitting a test signal, wherein the input signal comprises an echo of the test signal.

6. A method according to claim 4, wherein said measuring and setting are applied iteratively with a different setting for the selectable period of delay so as to identify the sequence of smaller components.

\* \* \* \* \*